United States Patent
Takeda

(10) Patent No.: US 8,293,585 B2
(45) Date of Patent: Oct. 23, 2012

(54) SOLID-STATE IMAGING DEVICE AND METHOD FOR MAKING THE SAME

(75) Inventor: Takeshi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 12/769,265

(22) Filed: Apr. 28, 2010

(65) Prior Publication Data

US 2010/0203671 A1   Aug. 12, 2010

Related U.S. Application Data

(62) Division of application No. 11/298,771, filed on Dec. 9, 2005, now Pat. No. 7,714,442.

(30) Foreign Application Priority Data

Dec. 10, 2004   (JP) ................................. 2004-357602

(51) Int. Cl.
    *H01L 21/00* (2006.01)
(52) U.S. Cl. .................. 438/118; 438/622; 257/758
(58) Field of Classification Search .................. 257/758; 438/118, 622

See application file for complete search history.

(56) References Cited

U.S. PATENT DOCUMENTS

| 6,734,103 | B2 * | 5/2004 | Katagiri et al. ............... 438/692 |
| 6,989,600 | B2 * | 1/2006 | Kubo et al. .................... 257/758 |
| 7,196,365 | B2 | 3/2007 | Yamamura |
| 2001/0008311 | A1 | 7/2001 | Harada et al. |
| 2001/0034119 | A1 | 10/2001 | Morozumi |
| 2004/0021227 | A1 * | 2/2004 | Watanabe ...................... 257/773 |

FOREIGN PATENT DOCUMENTS

| JP | 2000-114259 A | 4/2000 |
| JP | 2003-324189 | 11/2003 |
| JP | 2004-221532 A | 8/2004 |

OTHER PUBLICATIONS

Japanese Office Action issued Dec. 14, 2004 for corresponding Japanese Application No. 2004-357602.

* cited by examiner

*Primary Examiner* — Anthony Ho
(74) *Attorney, Agent, or Firm* — Rader Fishman & Grauer, PLLC

(57) ABSTRACT

A solid-state imaging device includes a semiconductor substrate, one or more wiring interlayer films disposed on or above the semiconductor substrate, and one or more metal wires embedded in the wiring interlayer films. The one or more wiring interlayer films are composed of a diffusion preventing material that prevents the diffusion of the metal wire.

2 Claims, 2 Drawing Sheets

SOLID-STATE IMAGING DEVICE AND METHOD FOR MAKING THE SAME

CROSS REFERENCES TO RELATED APPLICATIONS

The subject matter of application Ser. No. 11/298,771 is incorporated herein by reference. The present application is a Divisional of U.S. Ser. No. 11/298,771, filed Nov. 9, 2005, which claims priority to Japanese Patent Application JP 2004-357602 filed in the Japanese Patent Office on Dec. 10, 2004, the entire contents of which are incorporated herein by reference.

BACKGROUND OF THE INVENTION

1. Field of the Invention

The present invention relates to a solid-state imaging device having a diffusion preventing film for preventing diffusion of metal constituting wires formed on or above a semiconductor substrate in which a plurality of photoelectric transducers are formed. The present invention also relates to a method for making the solid-state imaging device.

2. Description of the Related Art

In recent years, as the semiconductor integrated circuits become finer, copper (Cu) wires are increasingly used, which activates the development of Cu-wiring processes. Formation of Cu wires is carried out by a damascene process with high production efficiency.

According to the damascene process, wiring interlayer films are formed by a chemical vapor deposition (CVD) process or an application process and dry-etched to form openings for trenches and vias. Subsequently, a metal, such as Cu, W, Al, Ag, Ta, TaN, Ti, or TiN, is buried in the openings by, for example, sputtering, CVD, or plating, and the excess metal is removed by chemical mechanical polishing (CMP). A diffusion preventing film composed of silicon nitride, silicon carbide, or the like is then formed on the polished surface to provide capping. This process is repeated when a multilevel Cu wiring structure is desired.

The diffusion preventing film is a film deposited after CMP to prevent diffusion of the metal of the metal wires. The wiring interlayer film is a film for forming through holes that connect metal wires of different levels to each other, gate electrodes to the metal wires of different levels, metal wires to the semiconductor substrate, etc.

The wiring interlayer film and the diffusion preventing film are usually composed of different materials since their target properties are different. For example, a material having a low dielectric constant is used in the wiring interlayer film to decrease the capacitance with respect to an adjacent wire. In contrast, the diffusion preventing film is desired to prevent metals of wires from migrating into transistor sections in the semiconductor substrate through the wiring interlayer film and to thereby prevent degradation of the properties such as leak current, white spot, black spot, etc.

As is discussed above, the wiring interlayer film and the diffusion preventing film are usually composed of different materials and exhibit different optical properties. For example, the wiring interlayer film is composed of silicon oxide and has a refractive index of about 1.6. In contrast, the diffusion preventing film is composed of silicon nitride and has a refractive index of about 2.0.

Light is reflected either partially or totally depending on the angle of incidence at the interface between films having different refractive indices. In a solid-state imaging device having Cu wires formed by a damascene process, incident light is reflected due to the difference in refractive index between the wiring interlayer film and the diffusion preventing film. This disadvantageously results in a decreased amount of light reaching the sensor, i.e., a photoelectric transducer such as a photodiode.

Japanese Unexamined Patent Application Publication No. 2003-324189 discloses a solid-state imaging device in which reflection of light due to the difference in refractive index between the wiring interlayer film and the diffusion preventing film is avoided by selectively removing a Cu-diffusion preventing film in the region overlaying the sensor in the semiconductor substrate as viewed in the thickness direction or the substrate, and then burying a film in that region.

SUMMARY OF THE INVENTION

According to the solid-state imaging device disclosed in Japanese Unexamined Patent Application Publication No. 2003-324189, a step of selectively removing the Cu-diffusion preventing film overlaying the sensor and the step of burying the new film in the removed region are needed after the deposition of the Cu-diffusion preventing film on the wiring interlayer film, disadvantageously resulting in an increased number of steps. Also, because the thickness of the layers overlaying the sensors differs from one cell to another, the selective removal of the diffusion preventing film may result in variation in amount of reflected and/or transmitted light and in nonuniform sensitivity of the sensors.

The present invention is made based on the above-described circumstances. It is preferable to reduce the light reflection due to the difference in refractive index between the wiring interlayer film and the diffusion preventing film without having to selectively remove the diffusion prevention film overlaying the sensor. It is also preferable to provide a solid-state imaging device in which diffusion of metal of the metal wires into the semiconductor substrate is prevented and a method for making such a solid-state imaging device.

According to an embodiment of the present invention, there is provided a solid-state imaging device including a semiconductor substrate; one or more wiring interlayer films disposed on or above the semiconductor substrate; and one or more metal wires embedded in the wiring interlayer films. The one or more wiring interlayer films are composed of a diffusion preventing material that prevents the diffusion of the metal wire and adjoin each other.

According to another embodiment of the present invention, there is provided a method for making a solid-state imaging device, the method including forming one or more wiring interlayer films on or above a semiconductor substrate; and forming one or more metal wires in the one or more wiring interlayer films, respectively, so that the metal wires are embedded in the wiring interlayer films. The one or more wiring interlayer films are composed of a diffusion preventing material that prevents diffusion of the metal wires and adjoin each other.

According to another embodiment of the present invention, there is provided a solid-state imaging device including a semiconductor substrate; an interlayer insulating film for preventing generation of capacitance between the semiconductor substrate and a metal wire to be formed, the interlayer insulating film being disposed on or above the semiconductor substrate; one or more wiring interlayer films disposed on or above the interlayer insulating film; and one or more metal wires respectively embedded in the one or more wiring interlayer films. Among the one or more wiring interlayer films, either the wiring interlayer film closest to the semiconductor substrate or this wiring interlayer film closest to the semiconductor substrate and one or more sequentially deposited wiring interlayer films are composed of a diffusion preventing material that prevents diffusion of the metal wires.

According to another embodiment of the present invention, there is provided a method for making a solid-state imaging device, the method including an interlayer insulating film forming step of forming an interlayer insulating film on or above a semiconductor substrate so that generation of capacitance between the semiconductor substrate and a metal wire to be formed is prevented; and a metal wire layer forming step including forming one or more wiring interlayer films on or above the interlayer insulating film formed in the interlayer insulating film forming step and then forming a metal wire in each wiring interlayer film such that the metal wire is embedded in the wiring interlayer film. Among the one or more wiring interlayer films, either the wiring interlayer film closest to the semiconductor substrate or this wiring interlayer film closest to the semiconductor substrate and one or more sequentially deposited wiring interlayer films are composed of a diffusion preventing material that prevents diffusion of the metal wires.

According to yet another embodiment of the present invention, there is provided a solid-state imaging device including a semiconductor substrate; an interlayer insulating film for preventing generation of capacitance between the semiconductor substrate and a metal wire to be formed, the interlayer insulating film being disposed on or above the semiconductor substrate; a diffusion preventing film for preventing diffusion from the metal wire, the diffusion preventing film formed on or above the interlayer insulating film; one or more wiring interlayer film disposed on or above the interlayer insulating film; and one or more metal wires disposed in the one or more wiring interlayer films so that the metal wires are embedded in the wiring interlayer films. The one or more wiring interlayer films adjoin each other.

According to still another embodiment of the present invention, there is provided a method for making a solid-state imaging device, the method including an interlayer insulating film forming step for forming an interlayer insulating film on or above a semiconductor substrate so that generation of capacitance between the semiconductor substrate and a metal wire to be formed is prevented; a diffusion preventing film forming step of forming a diffusion preventing film for preventing diffusion of the metal wire, the diffusion preventing film being formed on or above the interlayer insulating film formed in the interlayer insulating film forming step; and a metal wire layer forming step including forming one or more wiring interlayer films on or above the interlayer insulating film formed in the interlayer insulating film forming step and then respectively forming one or more metal wires in the one or more wiring interlayer films such that the metal wires are embedded in the wiring interlayer films. The one or more wiring interlayer films are adjoining each other.

DESCRIPTION OF THE PREFERRED EMBODIMENTS

Wiring interlayer films in which metal wires are formed and which overlay the semiconductor substrate are formed from the same diffusion preventing material. In detail, either the wiring interlayer film closest to the semiconductor substrate or this closest wiring interlayer film and one or more wiring interlayer films sequentially deposited on this closest wiring interlayer film may be formed from the same diffusion preventing material. Alternatively, a diffusion preventing film may be disposed under the wiring interlayer film.

First Embodiment

A solid-state imaging device and a production method therefor will now be described with reference to drawings.

Figure 1:
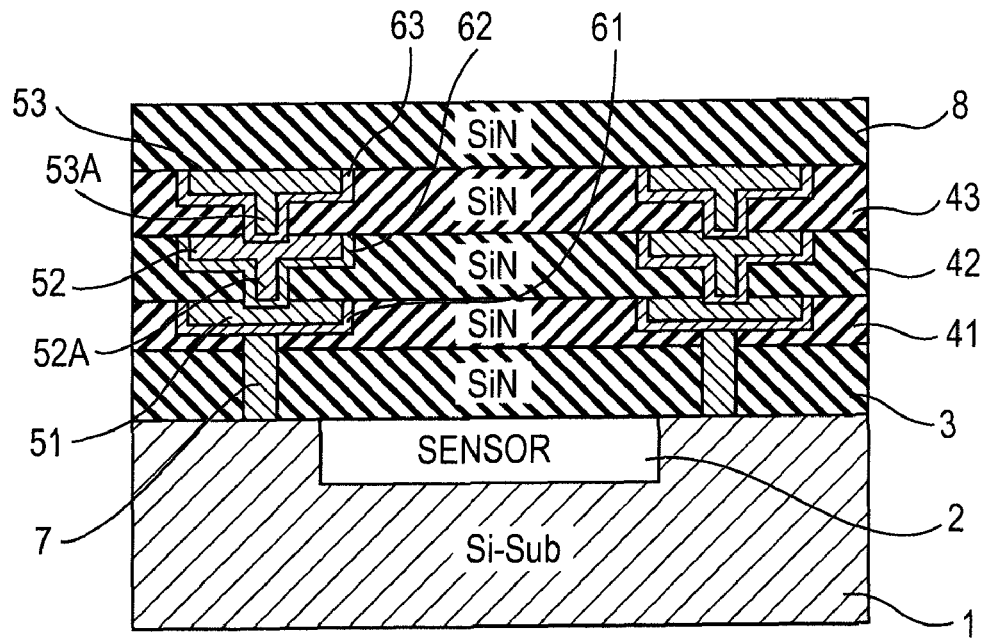
FIG. 1 is a cross-sectional view showing a solid-state imaging device and a production method therefor according to a first embodiment.

FIG. 1 is a cross-sectional view of a solid-state imaging device and a production method therefor according to a first embodiment.

As shown in FIG. 1, the solid-state imaging device of the first embodiment includes a silicon (Si) substrate 1 including a sensor 2, which is a photoelectric transducer such as a photodiode; and metal wires 51, 52, and 53 stacked on the Si substrate 1. An interlayer insulating film 3 for preventing generation of capacitance between the Si substrate 1 and the metal wires 51, 52, and 53 is disposed on the Si substrate 1, and wiring interlayer films 41, 42, and 43 are sequentially formed on the interlayer insulating film 3. A protective film 8 is disposed on the wiring interlayer film 43.

A color filter and an on-chip lens are disposed on the protective film 8 but are not shown in the drawings since they are not directly relevant to the present invention.

A gate electrode and the associated components (not shown) are formed in the interlayer insulating film 3. The metal wires 51, 52, and 53 formed by a dual damascene process are respectively embedded in the wiring interlayer films 41, 42, and 43. The metal wires 51, 52, and 53 are each composed of, for example, Cu, W, Al, Ag, Ta, TaN, Ti, or TiN. A contact plug 7 for connecting the metal wires 51, 52, and 53 with the Si substrate 1 is formed in the wiring interlayer film 41 and the interlayer insulating film 3. The metal wires 51, 52, and 53 are respectively embedded in the wiring interlayer films 41, 42, and 43 with barrier films 61, 62, and 63 therebetween. The barrier films 61, 62, and 63 are composed of a diffusion preventing material that prevents diffusion from the metal wires 51, 52, and 53. Examples of such a material include tantalum and tantalum nitride. The metal wire 52 is integrally combined with a via 52A of the corresponding layer, and the metal wire 53 is integrally combined with a via 53A of the corresponding layer.

The interlayer insulating film 3, the wiring interlayer films 41, 42, and 43, and the protective film 8 are composed of the same diffusion preventing material, such as silicon nitride or silicon carbide, that prevents diffusion from the metal wires 51, 52, and 53.

In the first embodiment, the interlayer insulating film 3, the wiring interlayer films 41, 42, and 43, and the protective film 8 are composed of the same diffusion preventing material. Thus, reflection of light due to the difference in refractive index between the wiring interlayer films and the diffusion preventing films can be reduced, and the decrease in amount of incident light can be suppressed. Moreover, the wiring interlayer films 41, 42, and 43 and the protective film 8 prevent diffusion from the metal wires 51, 52, and 53. Furthermore, selective removal of the diffusion preventing film overlaying the sensor 2, which has been necessary in the past, is no longer needed. Thus, the number of steps does not increase, and the decrease in production efficiency and the increase in cost can be suppressed.

When the protective film 8 is made from a material, such as silicon oxide, different from the diffusion preventing material, e.g., silicon nitride or silicon carbide, the diffusion from the metal wire 53 may occur from the top face of the metal wire 53 but the diffusion into the inter-wire film 43 is prevented. In this manner, there is only one interface between layers having different refractive indices, i.e., the interface between the wiring interlayer film 43 and the protective film 8. Thus, compared to a past case in which each of the metal wires is provided with a diffusion preventing film to conduct capping, the amount of reflected light can be decreased while preventing diffusion from the metal wires into the Si substrate 1.

The interlayer insulating film 3 prevents generation of capacitance between the Si substrate 1 and the metal wires 51, 52, and 53. The interlayer insulating film 3 and the wiring interlayer film 41 may be integrally formed as one component.

Since the wiring interlayer films 41, 42, and 43 are composed of the same diffusion preventing material, formation of the barrier films 61, 62, and 63 may be omitted.

Second Embodiment

Figure 2:
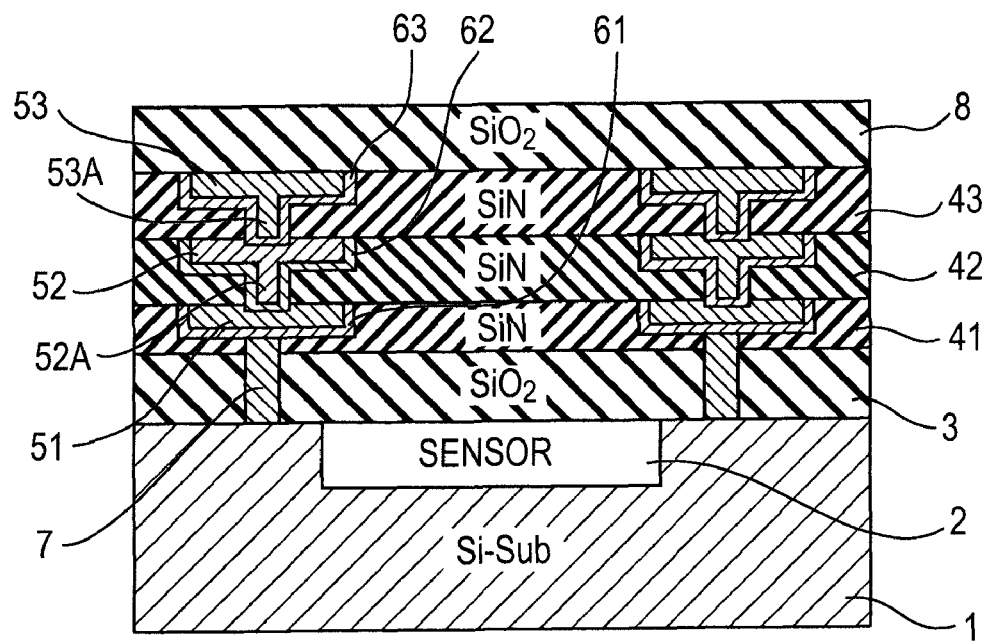
FIG. 2 is a cross-sectional view showing a solid-state imaging device and a production method therefor according to a second embodiment.

FIG. 2 is a cross-sectional view showing a solid-state imaging device and a production method therefor according to a second embodiment.

As shown in FIG. 2, the solid-state imaging device and the method of the second embodiment are different from those of the first embodiment shown in FIG. 1 in that, while the wiring interlayer films 41, 42, and 43 are composed of the same diffusion preventing material such as silicon nitride or silicon carbide, the interlayer insulating film 3 and the protective film 8 are composed of a material different from the diffusion preventing material. For example, the interlayer insulating film 3 and the protective film 8 are composed of silicon oxide.

According to the structure of the second embodiment, although diffusion of the metal wire 53 occurs from the top surface, the diffusion into the wiring interlayer film 43 is prevented.

Moreover, there are only two interfaces between the layers having different refractive indices, namely, the interface between the interlayer insulating film 3 and the wiring interlayer film 41 and the interface between the wiring interlayer film 43 and the protective film 8. Thus, compared to a past case in which each of the metal wires is provided with a diffusion preventing film to conduct capping, the amount of reflected light can be decreased while preventing diffusion from the metal wires into the Si substrate 1.

Third Embodiment

Figure 3:
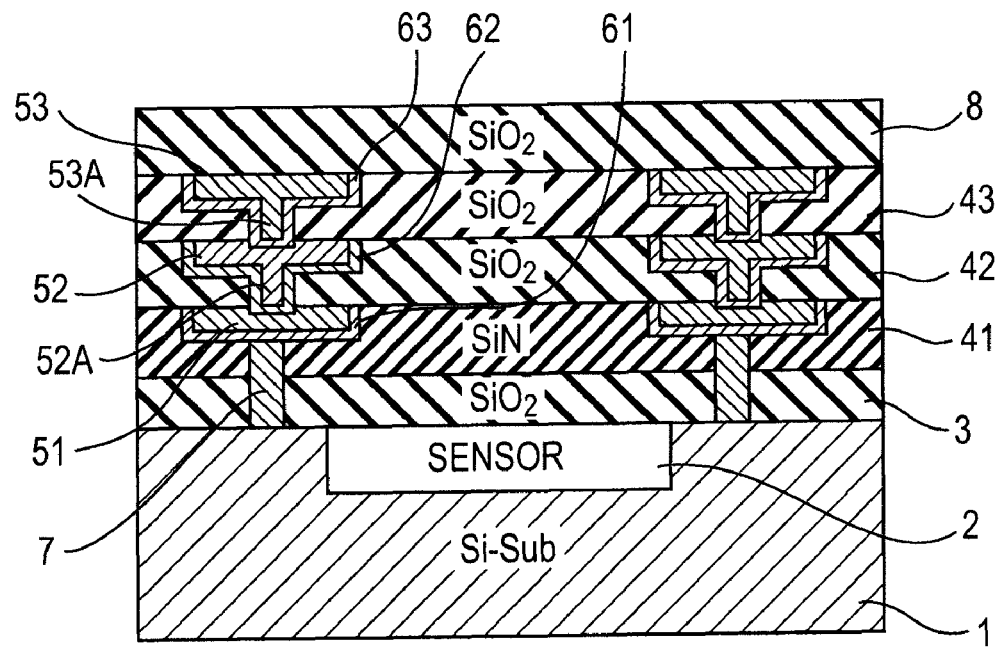
FIG. 3 is a cross-sectional view showing a solid-state imaging device and a production method therefor according to a third embodiment.

FIG. 3 is a cross-sectional view showing a solid-state imaging device and a production method therefor according to a third embodiment.

As shown in FIG. 3, the solid-state imaging device and the method of the third embodiment differ from those of the first embodiment shown in FIG. 1 in that the lowermost wiring interlayer film, i.e., the wiring interlayer film 41, among the wiring interlayer films 41, 42, and 43 is composed of the same diffusion preventing material (silicon nitride or silicon carbide) as that used in the first embodiment, and that the wiring interlayer films 42 and 43, the interlayer insulating film 3, and the interlayer insulating film 3 are composed of a material, e.g., silicon oxide, different from the diffusion preventing material.

According to the third embodiment, although the metal wires 51, 52, and 53 diffuse from upper surfaces, diffusion into the wiring interlayer film 41 is prevented.

Moreover, there are only two interfaces between the layers having different refractive indices, namely, the interface between the interlayer insulating film 3 and the wiring interlayer film 41 and the interface between the wiring interlayer films 41 and 42. Thus, compared to a past case in which each of the metal wires is provided with a diffusion preventing film to conduct capping, the amount of reflected light can be decreased while preventing diffusion from the metal wires into the Si substrate 1.

Of the wiring interlayer films 41, 42, and 43, the wiring interlayer films 41 and 42 may be composed of the same diffusion preventing material. In other words, by forming one wiring interlayer film closest to the Si substrate or sequentially deposited wiring interlayer films including this closest film and one or more wiring interlayer films adjacent to the closest film with the same diffusion preventing material, the number of the interfaces between layers with different refractive indices can be reduced to two.

Fourth Embodiment

Figure 4:
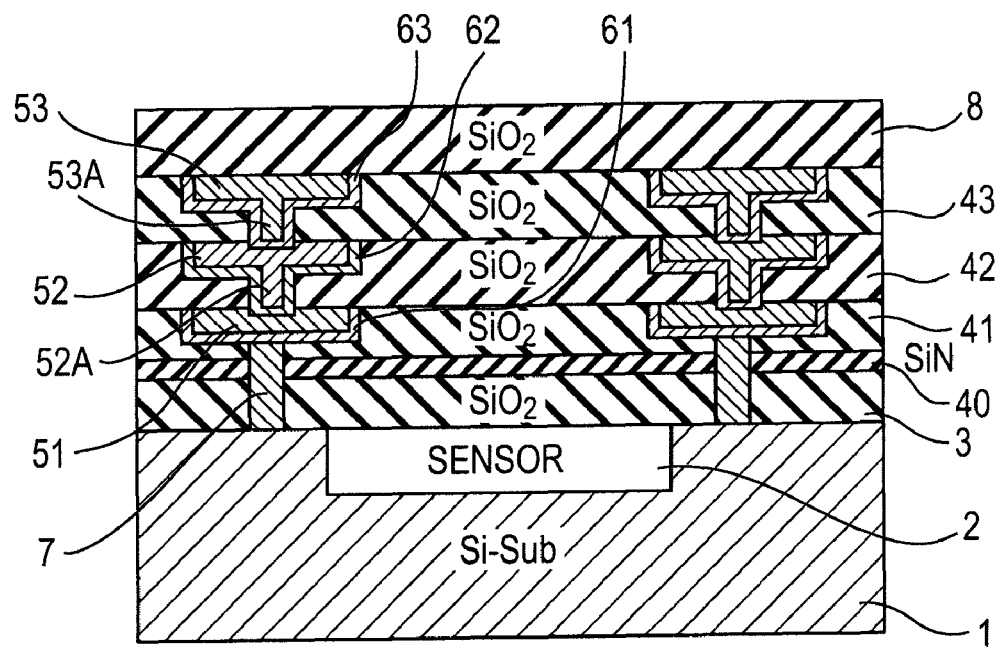
FIG. 4 is a cross-sectional view showing a solid-state imaging device and a production method therefor according to a fourth embodiment.

FIG. 4 is a cross-sectional view showing a solid-state imaging device and a production method therefor according to a fourth embodiment.

As shown in FIG. 4, the solid-state imaging device and the method of the fourth embodiment are the same as those of the first to third embodiments in that the metal wires 51, 52, and 53 are sequentially formed on the Si substrate 1 having the sensor 2, which is a photoelectric transducer such as a photodiode, but are different in that a diffusion preventing film 40 is disposed to separate the interlayer insulating film 3 from the wiring interlayer films 41, 42, and 43 in which the metal wires 51, 52, and 53 are embedded.

The interlayer insulating film 3 is formed on the Si substrate 1 to prevent generation of capacitance between the Si substrate 1 and the metal wires 51, 52, and 53, and the diffusion preventing film 40 composed of silicon nitride or silicon carbide is formed on the interlayer insulating film 3. The wiring interlayer film 41 is formed on the diffusion preventing film 40, the wiring interlayer film 42 is formed on the wiring interlayer film 41, and the wiring interlayer film 43 is formed on the wiring interlayer film 42 and the protective film 8 is formed on the wiring interlayer film 43.

The interlayer insulating film 3, the wiring interlayer films 41, 42, and 43, and the protective film 8 are composed of the same material, e.g., silicon oxide, different from that constituting the diffusion preventing film 40.

According to the fourth embodiment, although the metal wires 51, 52, and 53 diffuse from the top surfaces, the diffusion into the diffusion preventing film 40 is prevented.

Moreover, there are only two interfaces between the layers with different refractive indices, namely, the interface between the interlayer insulating film 3 and the diffusion preventing film 40 and the interface between the diffusion preventing film 40 and the wiring interlayer film 41. Thus, compared to a past case in which each of the metal wires is provided with a diffusion preventing film to conduct capping, the amount of reflected light can be decreased while preventing diffusion from the metal wires into the Si substrate 1.

It should be understood by those skilled in the art that various modifications, combinations, sub-combinations and alterations may occur depending on design requirements and other factors insofar as they are within the scope of the appended claims or the equivalents thereof.

What is claimed is:

1. A method for making a solid-state imaging device, the method comprising:
   providing a diffusion preventing film formed from a diffusion preventing material, an interlayer insulating film formed from an insulating material being between a substrate and said diffusion preventing film;
   providing a protective film formed from said insulating material, wiring interlayer films formed from an interlayer material being between said diffusion preventing film and said protective film;
   providing a photoelectric transducer in said substrate,
   wherein a portion of the diffusion preventing film is between said photoelectric transducer and portions of the wiring interlayer films, said portions of the wiring interlayer films being between a portion of the protective film and said portion of the diffusion preventing film,
   wherein one of the wiring interlayer films is in physical contact with another of the wiring interlayer films.

2. A method for making a solid-state imaging device, the method comprising:
   providing a diffusion preventing film formed from a diffusion preventing material, an interlayer insulating film formed from an insulating material being between a substrate and said diffusion preventing film;
   providing a protective film formed from said insulating material, wiring interlayer films formed from an interlayer material being between said diffusion preventing film and said protective film;
   providing metal wires in one of the wiring interlayer films and metal wires in said another of the wiring interlayer films, said one of the wiring interlayer films being in physical contact with another of the wiring interlayer films;
   providing a contact plug, said contact plug connecting said substrate with said metal wires in said one of the wiring interlayer films,
   wherein said contact plug is through said diffusion preventing material.

* * * * *